United States Patent
Sumption et al.

(10) Patent No.: US 8,948,830 B2
(45) Date of Patent: Feb. 3, 2015

(54) FAST-CYCLING, CONDUCTION-COOLED, QUASI-ISOTHERMAL, SUPERCONDUCTING FAULT CURRENT LIMITER

(75) Inventors: Michael Sumption, Newark, OH (US); Edward Collings, Columbus, OH (US); Milan Majoros, Columbus, OH (US)

(73) Assignee: The Ohio State University, Columbus, OH (US)

( * ) Notice: Subject to any disclaimer, the term of this patent is extended or adjusted under 35 U.S.C. 154(b) by 184 days.

(21) Appl. No.: 13/813,060

(22) PCT Filed: Jul. 29, 2011

(86) PCT No.: PCT/US2011/045994
§ 371 (c)(1),
(2), (4) Date: Apr. 12, 2013

(87) PCT Pub. No.: WO2012/016202
PCT Pub. Date: Feb. 2, 2012

(65) Prior Publication Data
US 2013/0190187 A1   Jul. 25, 2013

Related U.S. Application Data

(60) Provisional application No. 61/368,808, filed on Jul. 29, 2010.

(51) Int. Cl.
*H01B 12/00* (2006.01)
*H01F 6/00* (2006.01)
*H01L 39/00* (2006.01)
*H02H 9/02* (2006.01)
*H01L 39/16* (2006.01)
*H01F 6/04* (2006.01)

(52) U.S. Cl.
CPC .............. *H02H 9/023* (2013.01); *H01L 39/16* (2013.01); *H01F 6/04* (2013.01)
USPC ............................................. 505/211

(58) Field of Classification Search
CPC ............ H01F 6/00; H01F 6/02; H01F 41/048
See application file for complete search history.

(56) References Cited

U.S. PATENT DOCUMENTS

| | | | |
|---|---|---|---|
| 2003/0021074 A1* | 1/2003 | Yuan et al. | 361/117 |
| 2006/0274458 A1* | 12/2006 | Tekletsadik | 361/19 |
| 2007/0127171 A1* | 6/2007 | Lee et al. | 361/19 |
| 2009/0086386 A1* | 4/2009 | Sargent et al. | 361/19 |

* cited by examiner

*Primary Examiner* — Colleen Dunn
(74) *Attorney, Agent, or Firm* — Standley Law Group LLP

(57) ABSTRACT

Fault Current Limiters (FCL) provide protection for upstream and/or downstream devices in electric power grids. Conventional FCL require the use of expensive conductors and liquid or gas cryogen handling. Disclosed embodiments describe FCL systems and devices that use lower cost superconductors, require no liquid cryogen, and are fast cycling. These improved FCL can sustain many sequential faults and require less time to clear faults while avoiding the use of liquid cryogen. Disclosed embodiments describe a FCL with a superconductor and cladding cooled to cryogenic temperatures; these are connected in parallel with a second resistor across two nodes in a circuit. According to disclosed embodiments, the resistance of the superconducting components and its sheath in the fault mode are sufficiently high to minimize energy deposition within the cryogenic system, minimizing recovery time. A scheme for intermediate heat storage also is described which allows a useful compromise between conductor length enabled energy minimization and allowable number of sequential faults to enable an overall system design which is affordable, and yet allows conduction cooled (cryogen free) systems which have fast recovery and allows for multiple sequential faults.

22 Claims, 6 Drawing Sheets

FAST-CYCLING, CONDUCTION-COOLED, QUASI-ISOTHERMAL, SUPERCONDUCTING FAULT CURRENT LIMITER

CROSS-REFERENCE TO RELATED APPLICATIONS

This non-provisional patent application claims the benefit of U.S. Provisional Patent Application No. 61/368,808 filed 29 Jul. 2010, which is hereby incorporated by reference as if recited fully herein.

TECHNICAL FIELD

The present application is in the field of electrical energy distribution and more particularly related to current limiters for mitigating faults therein.

BACKGROUND

As electrical distribution grids continue to grow in both size and complexity, the need to control and mitigate inevitable faults within these systems is an ongoing issue. Fault Current Limiters (FCL) are devices for protection of components and parts of electrical distribution networks. The role of a FCL is to act as a fast switching element, much faster than existing circuit breakers. The FCL is introduced into the power distribution network in series with a load. If the load shorts, a high current would be generated; the high current has the capacity to damage other devices in the network. The FCL is activated once the load shorts and the high current is initiated. The FCL, once activated, acts to suppress the large current transient and thus protect other devices. Conventional fault current limiting technology leaves considerable room for improvement in both cost and timeliness of the responsive to faults.

Depending on their architecture, superconducting FCLs fall into one of two main categories, resistive or inductive. Inductive FCLs themselves come in many designs; the simplest is a transformer with the primary in series with the load and a closed superconducting ring as the secondary. In unfaulted operation, there is no resistance in the secondary and so the inductance of the device is low. A fault current quenches the superconductor (SC), the secondary becomes resistive and the inductance of the whole device rises, increasing the impedance of the primary winding and limiting the fault. While many variants of the inductive type limiters exist, the main advantage of this design is that there is no heat ingress through current leads into the SC, and so the cryogenic power load may be lower. However, inductive FCL typically require substantially more superconductor wire than resistive type, leading to comparatively larger AC losses as well as initial capital costs.

Conventional resistive type FCL, on the other hand, operate based on the principle that the load current passes directly through the superconductor (SC) element, and when a high fault current begins, the superconductor quenches: it becomes a normal conductor as the temperature and thus the resistance rises sharply and quickly. This extra resistance in the system reduces the fault current from what it would otherwise be (the prospective fault current) but correspondingly, creates a large increase in temperature that must be removed. If the superconductor operates in a temperature range that falls within convenient liquid cryogen temperature ranges, the excess energy can quickly be removed by exposure to the liquid cryogen. However, liquid cryogen requires substantial engineering and handling costs due to, among other things, generated pressures during cooling of the superconductor. In contrast, conduction cooling has been viewed as impractical for conventional systems due to the relatively low energy removal rates compared to liquid cryogen immersion.

A resistive FCL can be either DC or AC. If it is AC, then there will be a steady power dissipation from AC losses (superconducting hysteresis losses and possibly eddy current losses) which must be removed by the cryogenic system. An AC FCL is usually made from wire wound non-inductively; otherwise the inductance of the device would introduce an unwanted, parasitic impedance.

Rapid response and recovery time are essential elements to FCL viability. In power utility applications, it would be desirable to have this recovery time as small as possible, within a second if possible. For some applications, recovery within minutes is acceptable, and in general there would be a tradeoff between shorter recovery time and acceptable system cost. Some proposed FCL based on Yttrium barium copper oxide (YBCO) superconductors and liquid cryogen cooling claim to offer rapid recovery time, however, the capital cost is very high. Potentially much lower cost systems based on Magnesium diboride ($MgB_2$) with the use of cryo-cooling systems have also been proposed, but as designed, these will have long recovery times relative to the limited fault (typically hours). The system disclosed in this work describes a low cost system which does not need liquid cryogen (instead using conduction-cryocooling), has low operating AC loss, and have fast recovery.

SUMMARY

This and other unmet needs of the prior art are met by compounds and methods as described in more detail below.

Generally, an FCL is enabled by a superconducting component. In order to work properly, this superconducting component must be maintained at cryogenic temperatures. Two promising superconducting materials for FCL use are YBCO and $MgB_2$. YBCO can operate in liquid nitrogen (77 K), while $MgB_2$ must operate at 20-30 K. The lower temperature operation of $MgB_2$ had been seen as a disadvantage due to the costs associated with achieving the required temperature range, but the low cost of $MgB_2$ relative to YBCO (an order of magnitude lower cost for $MgB_2$ per unit volume) makes $MgB_2$ based systems competitive.

In order to enable, for example, $MgB_2$ based FCLs, a design first must be made where the energy dump during the fault is controlled, and the amount injected into the superconducting coil is kept low enough to prevent damage to the coil. The system must also act fast enough to suppress the quench, which is design dependent. Finally, the recovery time of the device (how long it takes it to come back to operational mode), which is a function of design, must be minimized. A design for an $MgB_2$ based FCL is presented below which will allow it to use a liquid cryogen free cooling system, using conduction-cryo-cooling, withstand the fault undamaged, and achieve a very rapid recovery time.

Disclosed embodiments describe a liquid cryogen free, conduction cooled, fast acting, resistive, superconducting fault current limiter, including an input node, an output node, a first impedance element (which is variable in its impedance) coupled between the input node and the output node, the first element, which is a superconductor, having an impedance which can be variable under either temperature or electric field; this first element being imbedded in a sheath of a second impedance element of a material, having a resistance $R_2$, which acts in parallel. A third current path (with a third impendence), also called a shunt may also be present, having resistance $R_3$, also coupled between the input node and the output node. The first impedance element and the second element are kept at cryogenic temperature through conductive cooling eliminating the necessity of liquid cryogen.

Disclosed embodiments describe FCLs wherein: the limiter relies on the current limitation-switching properties of a superconductor, rather than the temperature switching properties of a superconductor, with this switching mode possible even with the choice of conduction cooling.

Disclosed embodiments describe FCLs wherein: the ratio of the resistance of the third element to the resistance of the first and second elements in parallel is sufficiently low enough during fault that the temperature rise in the first and second impedance elements are zero at the end of the recovery after a fault, and the recovery time is on the order of seconds or some few minutes.

Disclosed embodiments describe FCLs wherein: the resistance of the first and second impedance elements are sufficiently high that the current flow and energy deposition are sufficiently low that the temperature rise as measured after the recovery of the fault is zero, and the recovery time is on the order of second or some few minutes. A current limiter wherein the superconductor is selected from the group consisting of $MgB_2$, cuprate superconductors, high-temperature superconductors, and the pnictides. A current limiter wherein the second impedance element, the sheath, is chosen from the group comprising monel, Cu—Ni alloys, stainless steel or other ductile, resistive non-magnetic metal The current limiter further comprising a cryo-cooler adapted to conductively cool the first and second impedance element. A current limiter wherein the cryo-cooler is selected from the group comprising: pulse tube, Gifford-McMahon, and Brayton cycle cryocoolers. A current limiter further comprising a switch, the switch adapted to uncouple the coil from the input node and the output node. A current limiter wherein the sheath is comprised of a material selected from the group comprising: high resistance transition metals, stainless steel, and nickel-based alloys.

BRIEF DESCRIPTION OF THE DRAWINGS

A better understanding of the exemplary embodiments of the invention will be had when reference is made to the accompanying drawings, wherein identical parts are identified with identical reference numerals, and wherein.

DETAILED DESCRIPTION

Figure 1:
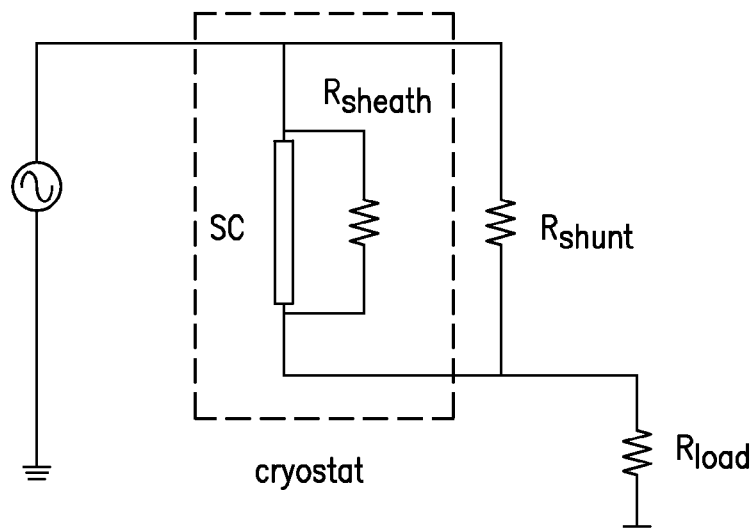
FIG. 1 is a schematic showing a superconducting fault current limiter in electric network environment.

Conventional FCL design focused on the idea of minimizing conductor volume. This was motivated by the large cost of suitable conductors, which could prove prohibitive. However, advances in SC materials have opened new avenues of development. One such material that has recently gained notice is $MgB_2$ which may range from 1-5\$/m, a fraction of the cost of conventional materials.

Most resistive FCLs rely on the heat of vaporization of liquid nitrogen to minimize recovery time, and also total wire length. However, this practice necessitates procedures and hardware to handle the evaporated nitrogen gas, which adds significantly to system complexity and cost. This, coupled with the high cost of a conductor that can operate at liquid nitrogen temperatures, makes such systems expensive.

Disclosed embodiments describe a system where conduction and cryo-cooling are used to remove the energy from the fault. Moreover, disclosed embodiments describe methods to do this with fast recovery, as compared to existing designs using conduction-cryo-cooling. Disclosed embodiments also describe devices and systems which require the coil's resistance to be sufficiently high that only the amount of energy that can be removed by a cryo-cooler within the desired recovery time is allowed into the cryogenic part of the system.

According to disclosed embodiments, the system uses an inexpensive medium temperature superconductor as its basis, and thus should be more cost competitive than systems based on High temperature superconductors (HTSC). The system allows a medium temperature SC to be used in a system which employs conduction cooling by a cryo-cooler only, and has a rapid recovery time. Conventional FCL systems use liquid cryogen to cool the coils, disclosed embodiments avoid the use of liquid or gas cryogen to directly cool the coils, minimizing cryogen handling, pressure build-up, and the cost associated with extensive cryogenic engineering of these devices. The use of liquid cryogen-free cooling had been seen as impractical previously, due to the longer times that would have been necessary to remove the excess energy deposited in the SC during fault. However, if the excess energy due to the fault is deposited elsewhere there is effectively no temperature rise in the SC allowing for a rapid recovery time in the absence of liquid cryogen. In addition to a rapid recovery time, the system is robust, and can withstand energy pulses many times (250 times) larger than the design limit under unexpectedly large fault scenarios. This kind of behavior is not possible with conventional resistive FCL designs due to their reliance on the temperature switching properties of the SC, namely that the SC becomes normal only after its temperature has increased significantly. Disclosed embodiments provide an improved service lifetime, as temperature gradients and temperature excursions are minimized.

Disclosed embodiments, unlike conventional resistive FCL systems which rely on temperature based ($T>T_c$) superconducting transition to act as the switching mode, use a current based transition to establish a resistive switching state. In order to accomplish this, the wire (SC and sheath in parallel) to be used should have maximal resistance per unit length at the operating temperature of the device. This resistance must be properly chosen to be as high as possible, but not so high as to lead to a quench at the electric fields to be put on the wire during fault conditions. The wire should also have maximal $J_e=I_c$/total cross sectional strand area.

Disclosed embodiments describe systems and devices designed for minimum recovery time. Optionally, embodiments incorporate choices for minimum complexity of the cooling system as well. $MgB_2$ does not operate within the range of a convenient liquid coolant, in disclosed embodiments, all heat is removed conductively.

Disclosed embodiments describe: a resistive type superconducting fault current limiter that is fast cycling and conduction cooled; a resistive type superconducting fault current limiter that relies on the current limitation switching properties of a superconductor, rather than the temperature switching properties of a superconductor, with this switching mode possible even with the choice of conduction cooling; a resistive type superconducting fault current limiter that is fast acting, and does not use liquid cryogen, and requires no gas handling during a fault event; a resistive type superconducting fault current limiter where the resistance of the wire as a whole (elements 1 and 2 in parallel) are sufficiently high that the temperature rise in the wire is very small as measured at the end of the recovery time (either zero for the first manifestation, or 1-2 K for the second manifestation), and in principle, for the first manifestation, any number of immediate repeat faults is possible; or a resistive type superconducting fault current limiter where an external shunt resistor is used and where the ratio of the energy deposition of that shunt to that of the fault current limiter coil is high enough that the temperature rise on of the wire is very small (either zero for the first manifestation, or 1-2 K for the second manifestation), and in principle, for the first manifestation, any number of immediate repeat faults is possible; or a resistive type superconducting fault current limiter where an external shunt resistor may be used and where the resistance of the coil (elements 1 and 2) are sufficiently high that the temperature rise on the wire is small after heat sharing of the element with an internal cryogenic heat sink.

FIG. 1 shows the typical, simple schematic of a fault current limiter in an electrical circuit. Disclosed embodiments describe a method of controlling fault currents with in a power (utility) grid comprising: coupling a superconducting electrical path between a first and a second node within the power grid, superconductor wire or strand consisting of a superconducting core, and an outer highly resistive outer sheath, both at cryogenic temperature, in parallel with a non-superconducting electrical path between the first and second node within the utility power grid, the non-superconducting electrical path is outside the cryogenic vessel and is at ambient temperature. Wherein the superconducting electrical path (first impedance element), the sheath (second impedance element) and the non-superconducting electrical path (third impedance element) are electrically connected in parallel. The resistance and/or impedance of the sheath of the wire is large, specifically sufficiently large that the energy deposition within it based on the prospective fault conditions is such that the temperature rise of the first impedance element is small, and this will typically make it much greater than the resistance and/or impedance of the non-superconducting electrical path. The resistance of the wire is in particular set to be such that the energy deposition is limited such that the temperature rise in the superconductor during any fault event can remain as low as possible. It is typical that certain not-too-high impedance is required for the FCL during fault mode. This impedance might typically need to be similar to the load impedance such that the current during fault is similar to the current during normal operation in order to maintain power in the grid. In general, for a fixed line voltage level and desired FCL impedance during fault conditions (and specified maximum fault conditions), there will be a certain minimum ratio of superconductor coil resistance to shunt resistor impedance required to lead to a sufficiently low energy deposition to allow minimal temperature rise of the superconducting element and thus fast recovery.

A fully equivalent criterion (for recovery time) can be achieved (with or without a shunt resistor) by considering the set operating conditions, the specified fault conditions, and the input voltage, and setting the superconducting coil to have a sufficiently high impedance that the energy deposition during fault is sufficiently low that the temperature rise is minimal, and thus the recovery is fast. This above discussion will be seen to apply to a first manifestation of the disclosed embodiments, as more fully described below. Alternatively, in a second manifestation, the resistance of the wire/coil (first and second elements) can be somewhat lower, if the additional energy can be stored in a highly thermally conductive heat storage device, a thermal mass, for intermediate time energy storage. The temperature rise of the coil (the wire, as a whole, wound into a coil shape) as measured at short times will be somewhat greater, but, as measured at a newly defined imperfect recovery time, allowed only to the point that the system can still operate within its specification as a FCL, and this after a predetermined number of faults.

Figure 2:
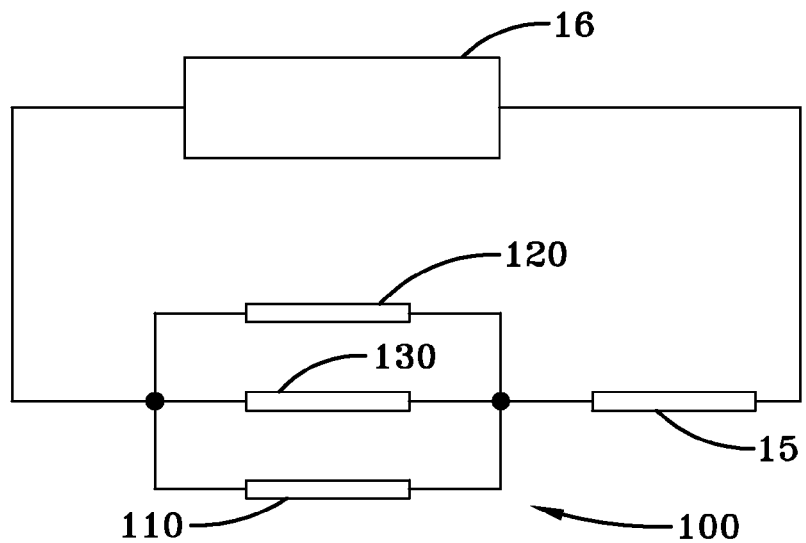
FIG. 2 is a schematic of an embodiment of a FCL in an electrical network.

FIG. 2 shows a schematic of a circuit diagram. The FCL device 100 is connected in a network. Here the load 15 is an impedance of a network branch from a power source 16 to be protected by the FCL device. Here, the FCL 100 is includes a with a dump resistor 110 the dump resistor is also referred to as a third impedance element. The superconductor 120 filament, is a mono-core superconductor covered with a sheath material 130 and optionally insulated by an insulator (not pictured). Then the FCL coil can be electrically modelled as a parallel connection of wire, cladding and dump resistor.

Figure 3:
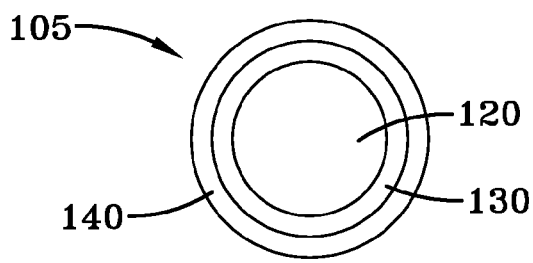
FIG. 3 is a cross-section of an embodiment of a wire for a FCL.

FIG. 3 is a schematic of the geometry of an exemplary strand. The superconductor filament 120 sits in the center, surrounded by the sheath material 130 and the optional insulator 140 along the length of the strand. In an exemplary embodiment, the superconductor filament is $MgB_2$, the sheath is chosen from the group comprising monel, Cu—Ni alloys, stainless steel or other ductile, resistive non-magnetic metal, and the optional insulator is Kapton.

Figure 4:
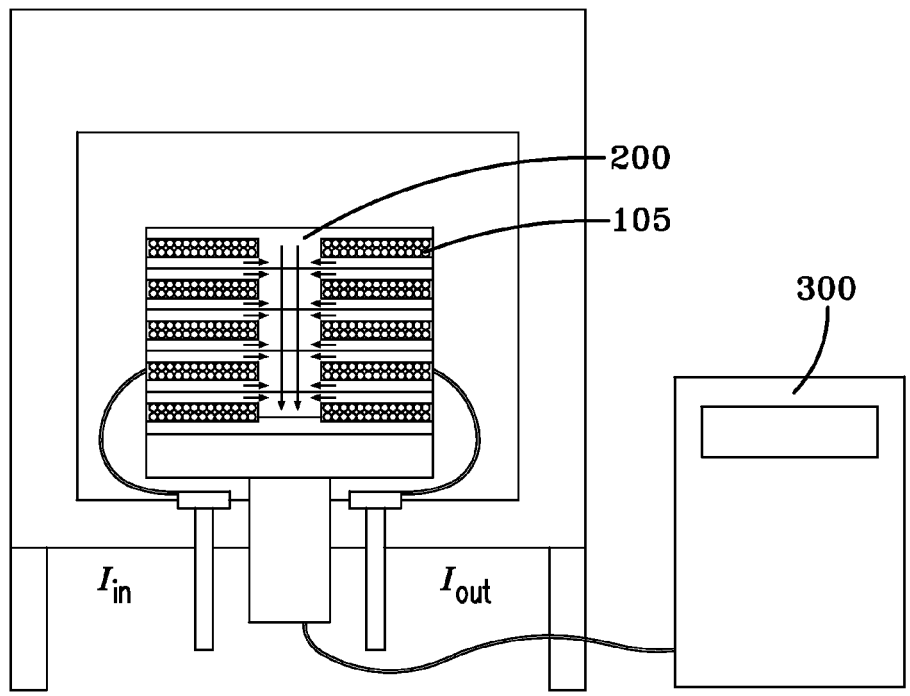
FIG. 4 is a schematic fault current limiter system with cryocooler and conduction heat path shown.

FIG. 4 shows a schematic fault current limiter system with cryocooler and conduction heat path shown. Here we can see the fault current limiter inside of an exemplary cold-box. The figure shows a cross-section of an exemplary FCL coil with wires 105 wound non-inductively around a former 200. In an embodiment, the former is comprised of a high-heat capacity, thermally conductive material that is readily machinable, suitable materials include non-magnetic steel, brass, copper and Cu—Ni alloys. Here, the cryo-cooler 300 is in thermal communication with the former 200. In an embodiment, the cryocooler is chosen from the group including pulse tube, Gifford-McMahon, and Brayton cycle cryocoolers.

Disclosed embodiments describe a system wherein one variant has, during fault conditions, the resistance and/or impedance ratio of the coil to the third element to be greater than 50; wherein the ratio is greater than 500; and wherein the ratio is greater than 1000. Alternatively, disclosed embodiments describe a system where the resistance of the superconductor in parallel with its sheath (the superconducting coil), while in the fault state, are such that the energy deposited during the fault, approximately $P\tau_{fault}=IE\tau_{fault}=W_c\tau_{recovery}$, in manifestation 1 (where P is the power deposited in the superconducting coil during the fault, $\tau_{fault}$, is the fault time, I and E are the current and voltage in the superconducting coil during the fault, $W_c$ is the cryocooler power removal capacity at the cold end, and $\tau_{recovery}$ is the desired full recovery time) or $P\tau_{fault}=IE\tau_{fault}=C_p V\Delta T$, in manifestation 2, where $C_p$ is the heat capacity of the effective volume of heat storage, and V is the effective volume of heat storage, and $\Delta T$ is chosen to be less than 1 K.

Figure 5:
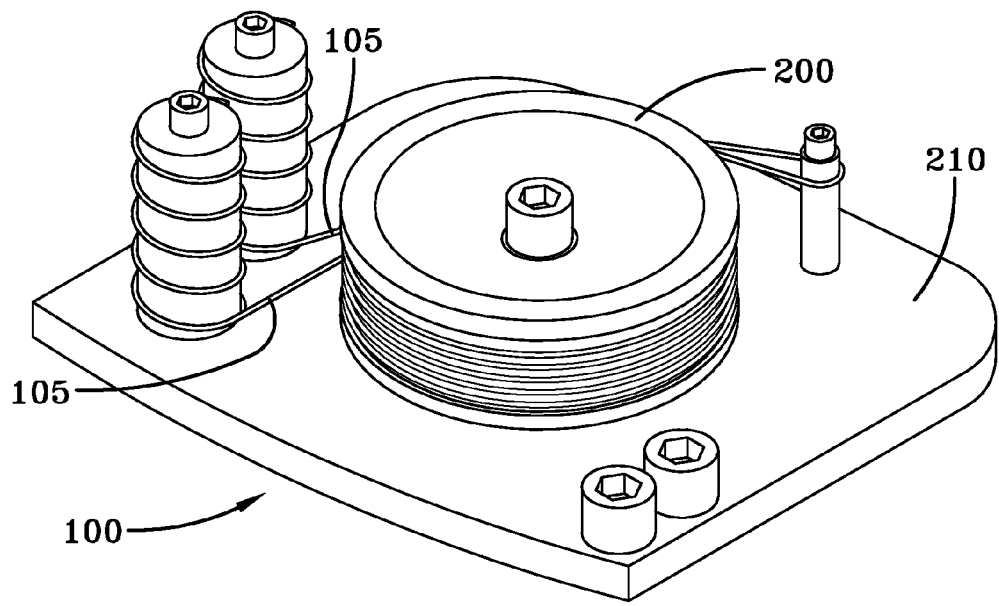
FIG. 5 is a diagram of an embodiment of an FCL.

FIG. 5 shows an embodiment of a FCL 100. Here, the wires 105 are wound non-inductively around a former 200. In an exemplary embodiment, the wires are wound such that full transposition occurs such as in a braid. The former is in thermal communication with an optional second thermal mass 210.

Figure 6:
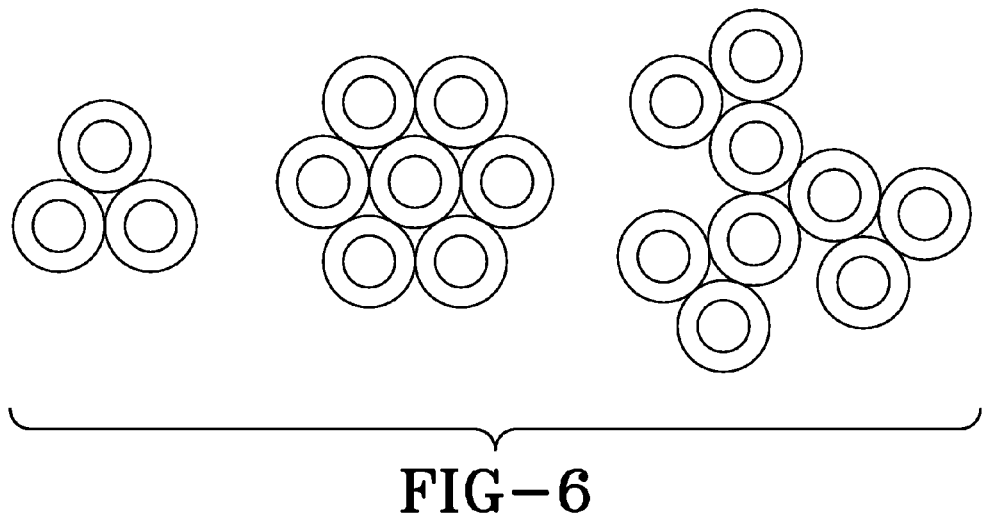
FIG. 6 shows fully or nearly fully transposed "braid" of monofilaments of round wire superconducting strands.

FIG. 6 shows a diagram of disclosed embodiments which describe FCLs wherein a monofilament superconductor wire is in a transposed or braided form (full transposition and electromagnetic decoupling against internal and external fields); wherein multi-filamentary superconductor wire is used. The figure shows fully or nearly fully transposed "braid" of monofilaments of round wire, important for loss minimization. Far left shows triplet, middle shows six-around 1, right shows triplet of triplet.

Figure 7:
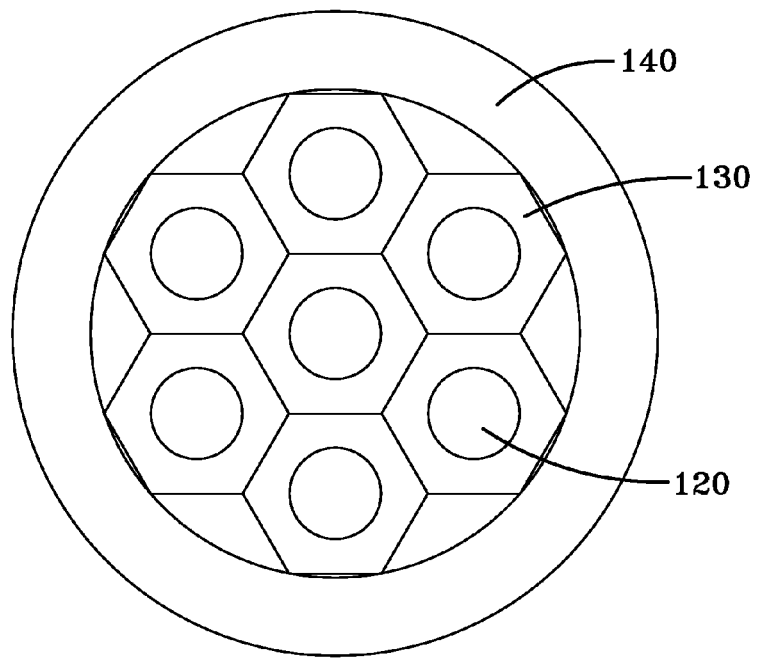
FIG. 7 is a schematic of a multi-filamentary strand with high permeability, low loss (soft) ferromagnetic shields around each filament for loss mitigation and manufacturing cost reduction.

Disclosed embodiments describe FCLs wherein a multifilamentary strand superconductor with magnetically decoupled filaments is used. The individual filaments may be surrounded or in the presence of elements in the strand which would prevent magnetic coupling between the filaments, leading to a low AC loss for the strand under self field conditions. FIG. 7 shows a multi-filamentary 120 strand with high permeability, low loss (soft) ferromagnetic sheaths 130 around each filament for loss mitigation and manufacturing cost reduction.

Figure 8:
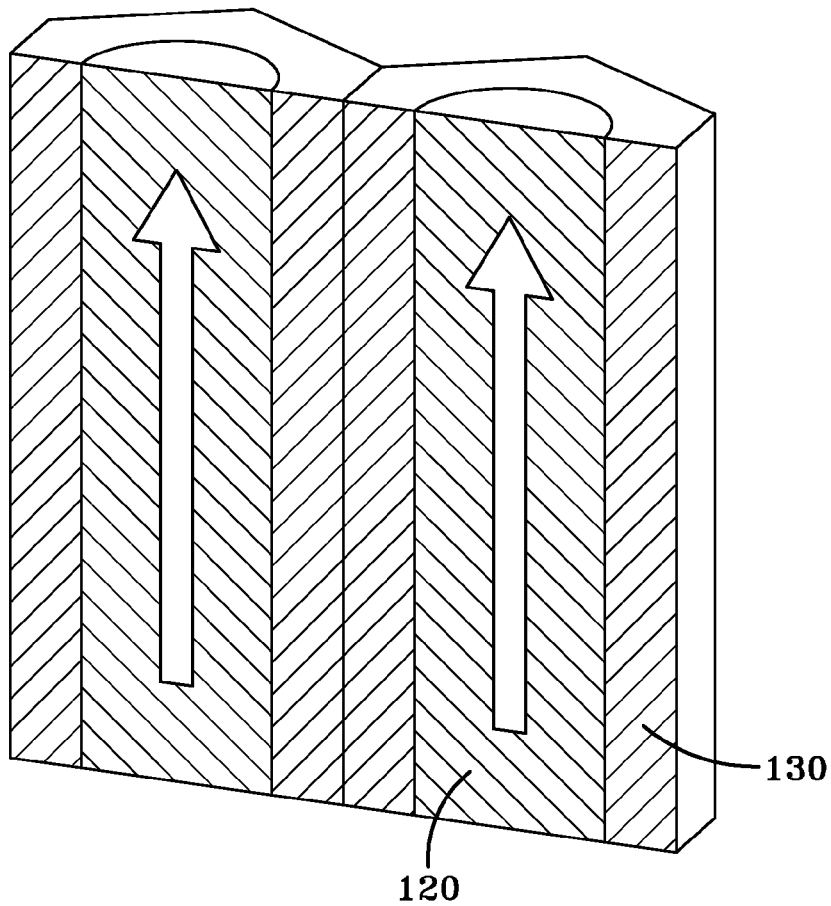
FIG. 8 shows self field magnetic fields contained within filamentary magnetic sheaths.

FIG. 8 is a longitudinal cross-section of a pair of exemplary wires with filaments 120 and sheath 130. The figure shows the self-field magnetic fields contained within filamentary magnetic sheaths. Current travels within filaments, while self fields from filaments circulate (in and out of the picture) in surrounding high permeability sheaths and do not interact with neighboring filaments.

Wherein the recovery times are less than 3 min, less than 1 min, less than 10 sec, less than 1 sec, less than 10 cycles.

Disclosed embodiments describe a fast-cycling resistive fault current limiter comprising: a fault current limiter coil, an external shunt resistor; and an internal cryogenic heat sink. The coil comprising: a plurality of interwoven wires forming a braid or otherwise fully decoupled parallel wires wound in a coil shape, in an embodiment, the wires form a braid, where full transposition occurs; and optional electrical insulation disposed around the resistive sheath; wherein the limiter is adapted to have a recovery time of less than 3 minutes between fault events; and wherein the resistance of the coil of interwoven strands is sufficiently high that less than 1K temperature rise (zero in the first manifestation, 1 K in the second manifestation) occurs in the coil in the event of a fault.

Figure 9:
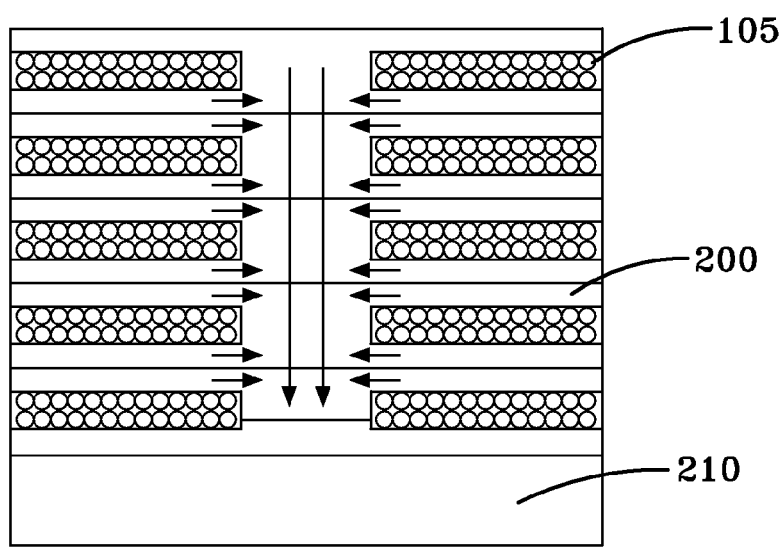
FIG. 9 is a schematic of an example of a coil cross section with embedded strands transferring heat.

FIG. 9 shows one example of a coil cross section with embedded wires 105 transferring heat (shown by arrows) to a former 200. The former 200 or thermal mass, is then in thermal communication with an optional second thermal mass.

Alternatively, within the same basic coil design, the interwoven wires are comprised of a monofilament superconductor; the active superconducting element consists of a strand or cable or braid of strands where the individual strands have many filaments within them and these filaments are magnetically isolated from one another by the use of magnetically highly permeable material surrounding each of them or nearby them.

The superconductor is selected from the group consisting of $MgB_2$, cuprate superconductors, high-temperature superconductors, and the pnictides. The limiter coil and the resistive sheath are adapted to be cooled to cryogenic temperature during use. In embodiments, the cladding/sheath is selected from the group comprising: high resistance transition metals, stainless steel, and nickel-based alloys.

Described limiters may rely on the current limitation switching properties of a superconductor (the variable impedance being controlled by the electric field), rather than the temperature switching properties of a superconductor, with this switching mode possible even with the choice of conduction cooling. That is, in contrast to conventional systems, the electric field generated in the coil by the excess current causes the fault current to flow to the shunt resistor due to the high total resistivity of the coil. This is a fast switching mechanism, preventing the excess current from increasing the temperature in the SC. Through this electric field switching property temperature increases are allowed only in the shunt resistor.

Figure 10:
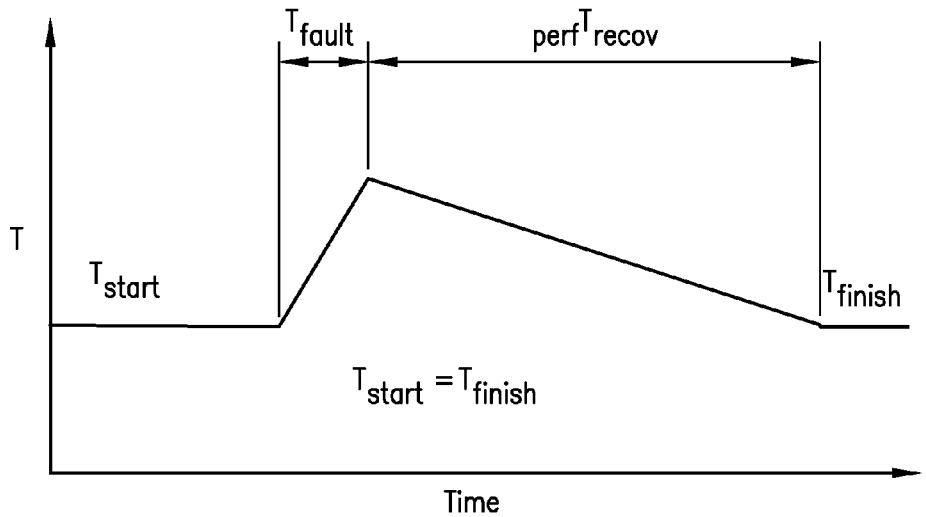
FIG. 10 is a graph showing the temperature rise for various elements during fault scenario, manifestation 1.

There are at least two general scenarios covered by FCL as described herein. In the first manifestation the FCL coil has a resistance high enough that the temperature rise in the coil is zero at the end of the recovery after a fault, and the recovery time is on the order of seconds or some few minutes. This is illustrated in FIG. 10. FIG. 10 shows a graph of the temperature rise for various elements during fault scenario, manifestation 1. Here $T_{fault}$ is, for example, 100 milliseconds, and $T_{recovery}$ is a perfect recovery, and is less than 3 minutes. The term perfect recovery refers to an insubstantial temperature increase in the SC, allowing for a large number of sequential faults.

In the first manifestation of the above limiter, the resistance of the first and second impedance elements (in parallel) are sufficiently high that the current flow and energy deposition are sufficiently low that the temperature rise as measured after the recovery of the fault is zero, and the recovery time is on the order of second or some few minutes.

Figure 11:
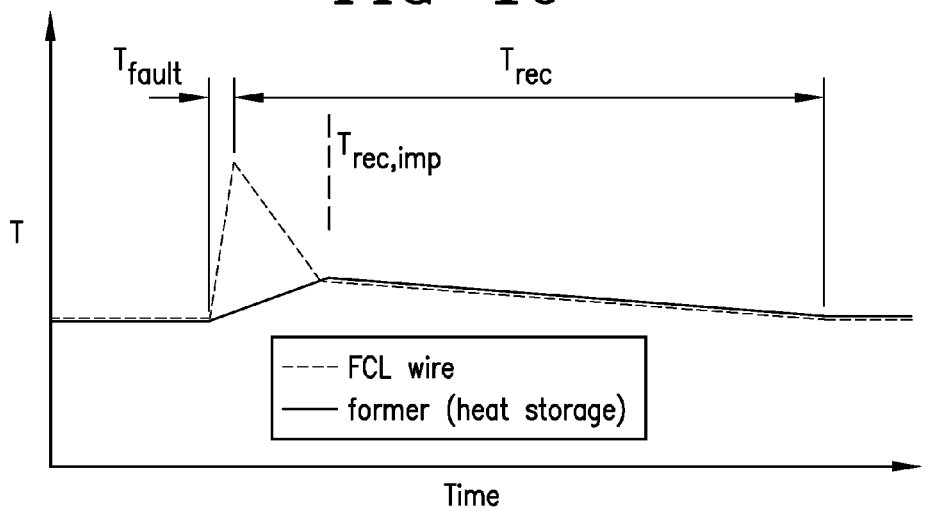
FIG. 11 is a graph showing the temperature rise for various elements during fault scenario 2, manifestation 2.

In a second manifestation of the fault current limiter described herein the coil resistance (first and second elements in parallel) is high enough, and the thermal grounding to an internal heat sink is high enough that the temperature rise of the first and second elements, as measured at the end of a short recovery time of the order of seconds or some few minutes is small compared to the operational temperature range of the superconducting element. The thermal mass and optional second thermal mass act as heat sinks and are designed to have high thermal capacity, especially relative to the filament, (high heat storage) and high thermal conductivity. In a second manifestation the small temperature rise as measured at the end of the recovery time (which we give the name imperfect recovery time) in the second element is enabled after heat sharing of the element with an internal cryogenic heat sink or thermal mass. The heat sink may comprise the former 200 about which the coil or wire is wound, and may be comprised of metals such as non-magnetic steel, Cu—Ni alloys, brass and the like. The system can sustain a predetermined number of immediate repeat faults. After a certain number of design faults, the system can reach full recovery by removing the heat from the internal heat sink to the outside world via the conduction and cryo-cooling system. This is illustrated in FIG. 11, where we see a schematic of the temperature rise for various elements during fault scenario 2, manifestation 2. Note that during the fault, the superconducting coil does reach a significant temperature rise (blue line), however, within a very short time, this energy is shared into an internal heat sink (the coil former, which is in intimate thermal communication with the wire).

Figure 12:
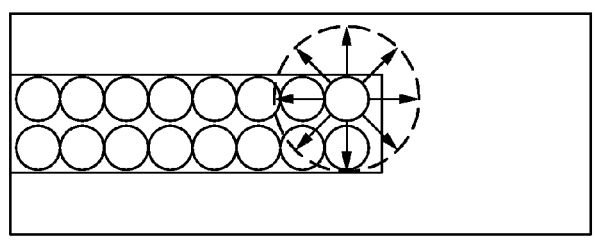
FIG. 12 is a detail of coil winding, showing heat storage and thermal diffusion distance.

FIG. 12 shows an expanded view of a section of the FCL shown in FIG. 9. In FIG. 12 it is shown that the heat will be shared with a certain physical volume within the coil former (the outer block in FIG. 12) during a time immediately following the fault. This will lower the temperature of the superconducting coil back to a small temperature rise above that of the starting (operating) temperature. This temperature rise can be made about 1 K, or in any case small enough that a designed number of sequential faults can be allowed before the system must be allowed to undergo complete recovery. After each event we see an imperfect recovery, but fully sufficient for full operation.

Disclosed embodiments describe FCL wherein the system is made to be fast recovery, to a partial but sufficient recovery, allowing for a set and designed number of sequential faults, by specifying the resistance of the first and second elements to be sufficiently high during the fault that only enough energy is admitted into the cryogenic portion of the device as can be stored in an intermediate heat storage device by transfer of the heat acquired during the active fault with elements 1 and 2 to this storage device, and that the transfer can be accomplished within a short time (some seconds or some few minutes), and that the temperature rise of the storage device and the first and second impedance elements can be sufficiently low that the fault current limiting sequence can be performed some number of times within a short time window (in fact, immediately after one another) without modifying the system performance.

To more fully describe manifestation 1: If W is the power removed by the cryocooler at cold temperature, and $t_{rec}$ is the desired recovery time, then $Wt_{rec}$ is the power that is allowed to dump into the cryogenic part of the FCL system. Because the ratio of the energy deposited in the coil to that deposited in a parallel shunt resistor is given by $P_{coil}/P_{shunt} = R_s/R_c = R_{FCL}/R_c$, the energy deposited in the coil can be kept below the energy limit defined above if the coil resistance is great enough. This allows the system to recover in a specified recovery time, using only cryo-cooling power. An equivalent treatment is given by $P\tau_{fault} = IE\tau_{fault} = W_c\tau_{recovery}$, in manifestation 1 (where P is the power deposited in the superconducting coil during the fault, $\tau_{fault}$ is the fault time, I and E are the current and voltage in the superconducting coil during the fault, $W_c$ is the cryo-cooler power removal capacity at the cold end, and $\tau_{recovery}$ is the desired full recovery time). The SC is kept cold, but is in the resistive state because of the electric field imposed on the conductor, rather than the temperature. The wire to be used should have maximal resistance per unit length at the operating temperature of the device. This resistance must be properly chosen to be as high as possible, but not so high as to lead to a quench at the electric fields to be put on the wire during fault conditions. The wire should also have maximal $J_e = I_c/$total strand cross sectional area.

In a manifestation 1 approach, It can also be shown that:

$$L_{COIL} = \frac{1}{2} \frac{R_{AEP}^2 \tau_F I_{LT}^2}{R_{WPUL} P_{cooler} \tau_{recovery}}$$

Where $L_{coli}$ is the length of the coil, $R_{AEP}$ is the desired resistance of the system during fault mode, $\tau_F$ the time period of the fault, $I_{LT}$ is the maximum current to be let through by the fault, $R_{WPUL}$ is the resistance of the superconducting wire (cable) per unit length, $P_{cooler}$ is the heat removal capacity of the cryo-cooler (or, the maximum power than can be removed the heat channel, if it is limiting), and $\tau_{recovery}$ is the desired recovery time. This expression only applies if an $I_{LT}$ which is similar (of the same order of magnitude) to the operational current is used. An equivalent expression can be generated in terms of line current and voltage, if it is desired that $R_{AEP}$ be as high as possible.

In a consideration useful for setting the maximum temperature rise (maximum excursion during the fault, not the rise as measured at the point of the imperfect recovery time) during a manifestation 2 of this system, the length of a superconducting coil considered adiabatically would be given by the following is a expression (in a simple analytical treatment of the design of an FCL):

$$L_{Coil} = \sqrt{\frac{\tau I_F^2 R_{AEP}^2}{\langle C_p \rangle \Delta T \pi R_a^2 R_{WPUL}}}$$

Where:
$R_a$ = cable effective radius
$R_{WPUL}$ = R cable per unit length
$C_p$ = Heat capacity
T = Temperature
$\tau$ = Fault time
$R_{AEP}$ = Design resistance
$I_F$ = Let through current, nominally same as $I_{LT}$ above In an embodiment (the second manifestation), the system is made to be fast recovery, allowing for a set and designed number of sequential faults, by specifying either the resistance ratio of the coil to the shunt (and system), or the resistance of the coil as compared to the line voltage and fault current as follows. Consider the former around which the wire is wound to be an intermediate energy storage device. Then if $\Delta E_{n,former}$ is the energy removed from the wire after the fault by using a cold thermal mass adjacent to the wire, $<W>$ is the time average power related to this energy transfer from the SC wire to the former, $t_{rec}$ is the desired recovery time, then $<W>t_{rec}$ is the power we are allowed to dump into the cryogenic part of the FCL system. Because the ratio of the energy deposited in the coil to that deposited in a parallel shunt resistor is given by $P_{coil}/P_{shunt}$ is the same as $R_s/R_c$ is the same as $R_{FCL}/R_c$, the energy deposited in the coil can be kept below the energy limit defined above if the coil resistance is great enough. Alternatively one can set $I_F V \tau_F = <W> t_{rec}$, where If is the fault current, V is the line voltage, $\tau_F$ and is the fault event time. Either condition allows the system to recover in a specified (quick) recovery time, using a cooled thermal mass to perform intermediate heat storage. The SC is kept cold, but is in the resistive state because of the electric field imposed on the conductor, rather than the temperature. For this recovery method, the temperature will come back to a temperature slightly above the starting temperature, but sufficiently close to the starting temperature that the operation of the FCL is not impeded. Specifically, this recovery is to a temperature that the SC can still carry the maximum allowable steady state current level for which the SFCL is designed. The number of successive cycles that occur back to back is now limited by a maximum temperature rise, but the number can be made reasonably and usefully large by design parameters of the former and coil. Specifically, the temperature rise will be given by $\Delta T_{system} = \Delta T_{w,no\ former}[(C_{pw} V_w)/(C_{pf} V_{f^*})]$, where $\Delta T_{system}$ is the temperature that the system (wire and former) will be at the end of the recovery, $C_{pw}$ is the heat capacity of the wire, $V_w$ is the volume of the wire, $C_{pf}$ is the heat capacity of the former, and $V_{f^*}$ is the volume of the former thermally accessible to heat transfer from the wire during the specified time. The time for complete and full recovery is still found (to within the given approximation) using the method described above.

Disclosed embodiments describe a FCL further comprising a fast acting switch on the exit side of the FCL coil, (that is, a switch which is in series with the first and second impedance elements, such that the parallel combination of the first and second impedance elements are now in series with the switch, and this combination is now in parallel with the third impedance element. With the objective to be able to take the coil (impedance elements 1 and 2) out of the circuit to further limit the energy deposition during the quench event, and to shorten further the recovery time. The switch might be conventional 5-6 cycle breaker, or a vacuum interrupter 2 cycle, or a similar fast acting switch.

Generally, there are 2 options for non-inductive winding of FCL coil—layer-by-layer winding with anti parallel currents and turn-by-turn winding with anti parallel currents. Turn-by-turn winding requires a simultaneous winding of a pair of 2 wires with just 1 loop at the beginning of the winding process. On the other hand, layer-by-layer winding requires many loops, practically after each layer, so this technique might be less practical for coils with a large number of layers. In actual operation, an FCL coil will carry its nominal current for most of the time, so steps should be taken so to minimize the AC losses. The same is valid also for optimally designed current leads. So, both AC losses and heat influx due to current leads must be kept on a minimum possible level.

The fact that FCL coil winding will be non inductive gives an opportunity to increase the efficiency of its conduction cooling by encasing the winding in a highly thermally conducting case, such as e.g. Cu. The non inductive winding should not produce a significant ac magnetic field in Cu case, so the heating by eddy currents should not be an issue.

Figure 13:
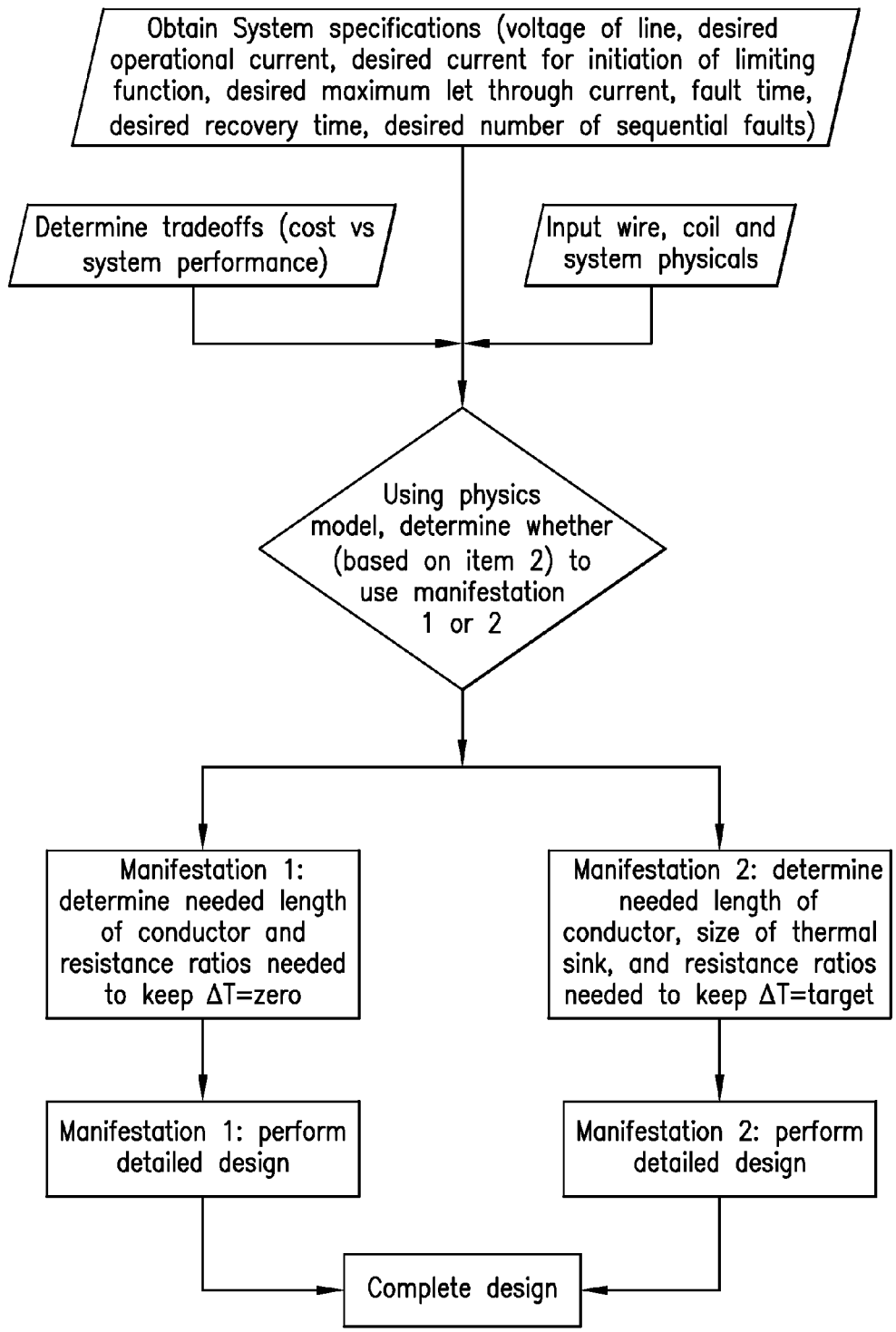
FIG. 13 is a flowchart detailing an embodiment of design parameters for a FCL.

FIG. 13 is a flowchart. The flowchart details parameters for making a FCL according to described embodiments.

The terms "a" and "an" and "the" and similar references used in the context of describing the disclosed embodiments (especially in the context of the following claims) are to be construed to cover both the singular and the plural, unless otherwise indicated herein or clearly contradicted by context.

Recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided herein is intended merely to better illuminate the disclosed embodiments and does not pose a limitation on the scope of the disclosed embodiments unless otherwise claimed. No language in the specification should be construed as indicating any non-claimed element essential to the practice of the disclosed embodiments or any variants thereof.

Groupings of alternative elements or embodiments disclosed herein are not to be construed as limitations. Each group member may be referred to and claimed individually or in any combination with other members of the group or other elements found herein. It is anticipated that one or more members of a group may be included in, or deleted from, a group for reasons of convenience and/or patentability Preferred embodiments of this invention are described herein, including the best mode known to the inventors for carrying out the invention(s). Of course, variations on the disclosed embodiments will become apparent to those of ordinary skill in the art upon reading the foregoing description. The inventors expect skilled artisans to employ such variations as appropriate, and the inventors intend for the invention(s) to be practiced otherwise than specifically described herein. Accordingly, this disclosure includes all modifications and equivalents of the subject matter recited in the claims appended hereto as permitted by applicable law. Moreover, any combination of the above described elements in all possible variations thereof is encompassed by the disclosed embodiments unless otherwise indicated herein or otherwise clearly contradicted by context.

Having shown and described an embodiment of the invention, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

What is claimed is:

1. A resistive type superconducting fault current limiter which is conduction cooled, using a cryocooler and no liquid cryogen, which has at the same time a fast recovery, comprising:
    an input node;
    an output node;
    a wire forming a coil, coupled between the input node and the output node, comprising:
    a first impedance element of a first material having resistance $R_1$ which can be variable under either temperature or electric field; and
    a second impedance element of a second material forming a sheath around the first impedance element, the material having resistance $R_2$; and
    a third impedance element of a third material having resistance $R_3$, coupled in parallel with the coil.

2. The current limiter of claim 1, wherein: the limiter relies on the current limitation-switching properties of a superconductor, rather than the temperature switching properties of a superconductor, with this switching mode possible even with the choice of conduction cooling.

3. The current limiter of claim 1, wherein: the ratio of the resistance of the third element to the resistance of the first and second elements in parallel is sufficiently low enough during fault that the temperature rise in the first and second impedance elements are zero at the end of the recovery after a fault, and the recovery time is on the order of seconds or some few minutes.

4. The current limiter of claim 1, wherein the resistance of the first and second impedance elements are sufficiently high that the current flow and energy deposition are sufficiently low that the temperature rise as measured after the recovery of the fault is zero, and the recovery time is on the order of second or some few minutes.

5. The current limiter of claim 1 wherein: $R_2/R_3$ is at least 100.

6. The current limiter of claim 5 wherein: the superconductor is selected from the group consisting of $MgB_2$, cuprate superconductors, high-temperature superconductors, and the pnictides, and the sheath is comprised of a material selected from the group comprising: high resistance transition metals, stainless steel, and nickel-based alloys.

7. The current limiter of claim 6 further comprising: a former around which the coil is wound and a cryo-cooler in thermal communication with the former, adapted to cool the first and second impedance elements.

8. The current limiter of claim 1 wherein: the first variable impedance element is cooled to below 100K during use.

9. The current limiter of claim 1 wherein: the superconductor is adapted to operate at below 30K.

10. The current limiter of claim 1 wherein: the superconductor is selected from the group consisting of $MgB_2$, cuprate superconductors, high-temperature superconductors, and the pnictides.

11. The current limiter of claim 1 further comprising: a cryocooler adapted to conductively cool the first and second impedance element.

12. The current limiter of claim 11 wherein: the cryocooler is selected from the group comprising: pulse tube, Gifford-McMahon, and Brayton cycle cryocoolers.

13. The current limiter of claim 1 further comprising: a switch, the switch adapted to uncouple the coil from the input node and the output node.

14. The current limiter of claim 1 wherein the sheath is comprised of a material selected from the group comprising: high resistance transition metals, stainless steel, and nickel-based alloys.

15. The current limiter of claim 1 adapted to sustain a predetermined number of immediate faults in succession.

16. The current limiter of claim 1 wherein the current limiter is adapted to switch between a normal state and a fault state based on current transition.

17. A fast-cycling resistive fault current limiter comprising:
    a fault current limiter coil, comprising:
        a plurality of interwoven wires forming a braid in a coil shape; the wires comprising:
        filaments of a variable impedance material; and
        a resistive sheath disposed around the filaments;
    an external shunt resistor; and
    a thermal mass for use as a heat sink;
wherein the limiter is configured to have a recovery time of less than 3 minutes between fault events.

18. The limiter of claim 17, wherein:
    the filaments are magnetically isolated from one another by the sheaths which are comprised of magnetically highly permeable material.

19. The limiter of claim 18 wherein: the superconductor is selected from the group consisting of $MgB_2$, cuprate superconductors, high-temperature superconductors, and the pnictides.

20. The limiter of claim 19 wherein: the limiter coil and the resistive sheath are adapted to be cooled to cryogenic temperature during use.

21. The limiter of claim 20 wherein: the ratio of the resistance of the sheath and the external shunt resistor is greater than 50.

22. The current limiter of claim 21 wherein: the ratio of the thermal capacity of the external shunt to the interwoven wires is sufficiently high that less than 1K temperature rise occurs in the first variable impedance element in the event of a fault.

\* \* \* \* \*